(12) United States Patent
Champeau et al.

(10) Patent No.: US 6,805,625 B2
(45) Date of Patent: Oct. 19, 2004

(54) HOUSING VENTILATION SYSTEM, HOUSING AND HOUSING PORTION, USE OF SAID SYSTEM, AND MOLD FOR MANUFACTURING

(75) Inventors: Hervé Champeau, Toulouse (FR); Olivier Forgerit, Toulouse (FR)

(73) Assignee: Siemens VDO Automotive, Toulouse Cedex (FR)

( * ) Notice: Subject to any disclaimer, the term of this patent is extended or adjusted under 35 U.S.C. 154(b) by 0 days.

(21) Appl. No.: 10/327,118

(22) Filed: Dec. 24, 2002

(65) Prior Publication Data

US 2003/0194964 A1 Oct. 16, 2003

(30) Foreign Application Priority Data

Dec. 28, 2001 (FR) ............................................. 01 16985

(51) Int. Cl.$^7$ ................................................. H05K 5/00
(52) U.S. Cl. ...................................... 454/184; 454/261
(58) Field of Search ................................ 454/184, 254, 454/275; 361/696

(56) References Cited

U.S. PATENT DOCUMENTS

| | | | | |
|---|---|---|---|---|
| 786,203 A | * | 3/1905 | Gailey ........................ | 210/247 |
| 3,628,443 A | * | 12/1971 | Henning ...................... | 454/316 |
| 4,557,095 A | * | 12/1985 | Rice et al. ................... | 52/473 |
| 5,201,879 A | * | 4/1993 | Steele ........................ | 454/184 |
| 5,372,543 A | * | 12/1994 | Steele ........................ | 454/184 |
| 5,467,250 A | * | 11/1995 | Howard et al. ............. | 361/696 |
| 6,198,627 B1 | * | 3/2001 | Roehling et al. ........... | 361/688 |
| 6,283,850 B1 | | 9/2001 | Kaetsu et al. | |
| 6,459,578 B1 | * | 10/2002 | Wagner ...................... | 361/694 |

FOREIGN PATENT DOCUMENTS

| | | |
|---|---|---|
| DE | 200 03 275 | 4/2000 |
| FR | 2 546 276 | 11/1984 |

* cited by examiner

Primary Examiner—Derek S. Boles
(74) Attorney, Agent, or Firm—Young & Thompson

(57) ABSTRACT

This system is for ventilating a housing or a housing portion that has to house a contents (39) and has ventilation grids (33, 35) for the contents, the grids being formed from segments of material leaving a gap between them, characterized in that these segments of material are arranged at at least two levels (9a, 9b) offset depthwise in the general direction of entry of a gaseous fluid into the housing or the housing portion through the grid in question, in order to constitute, by grid, a multiple-grid system, the grids being offset depthwise with respect to one another.

16 Claims, 4 Drawing Sheets

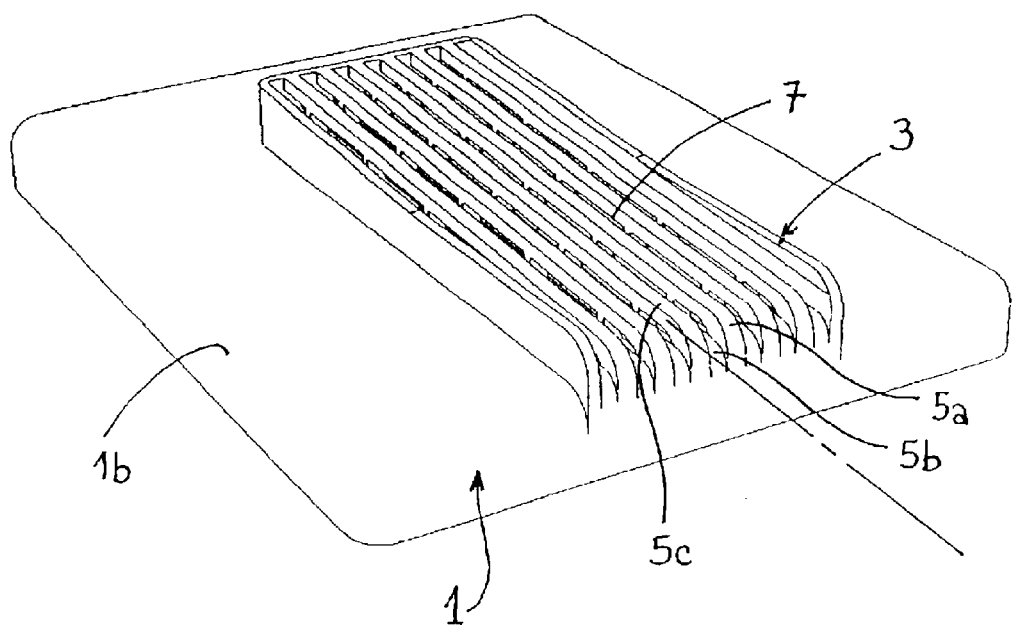
FIG_1

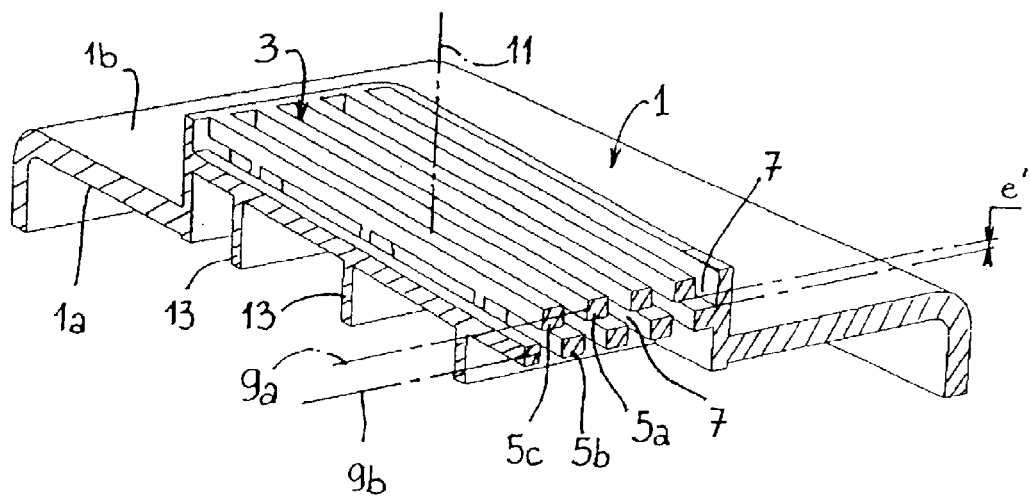
FIG_2
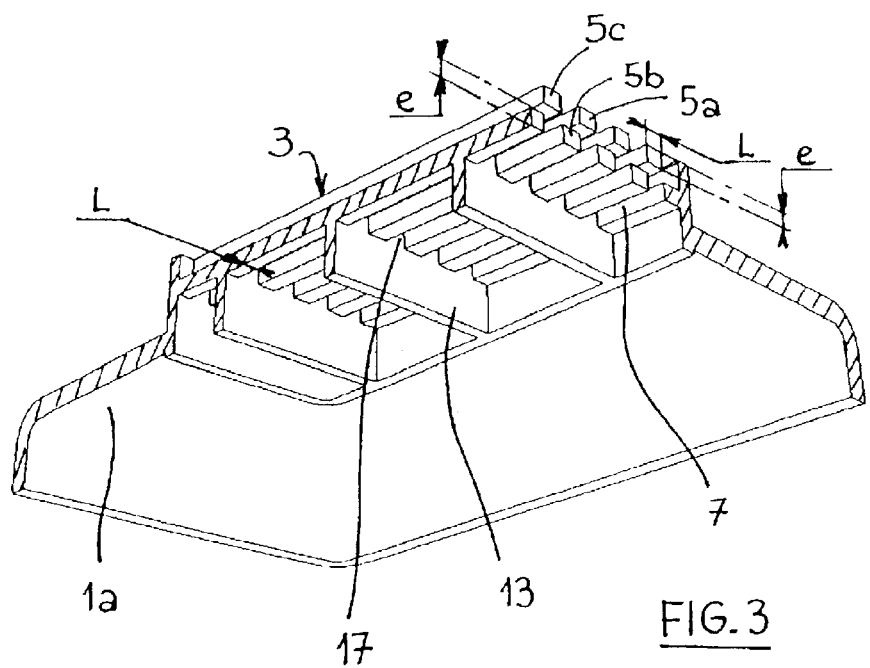
FIG.3

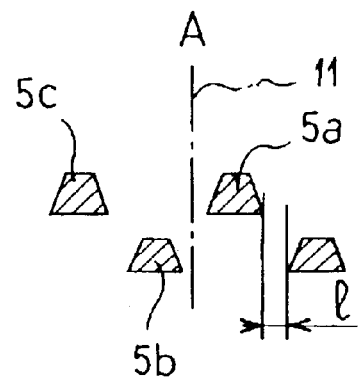
FIG_4
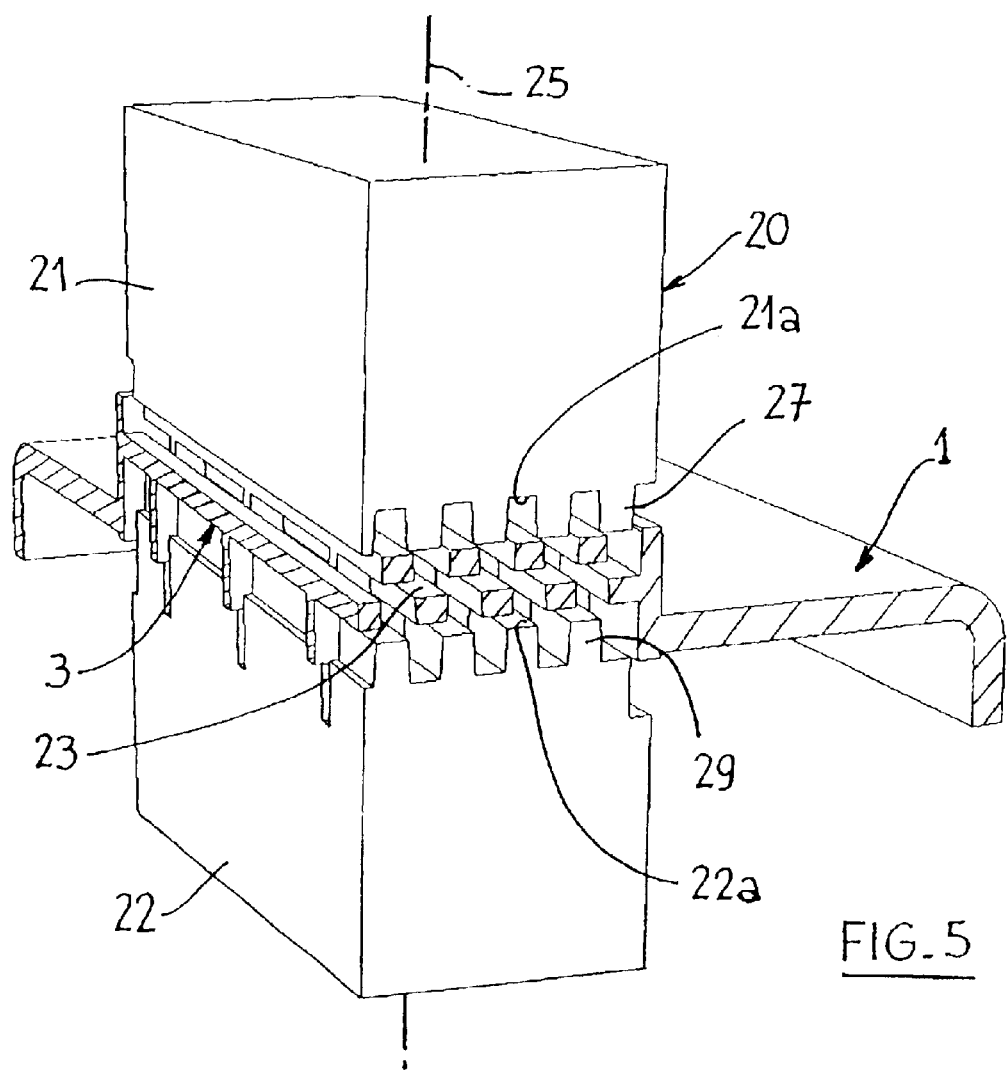
FIG_5

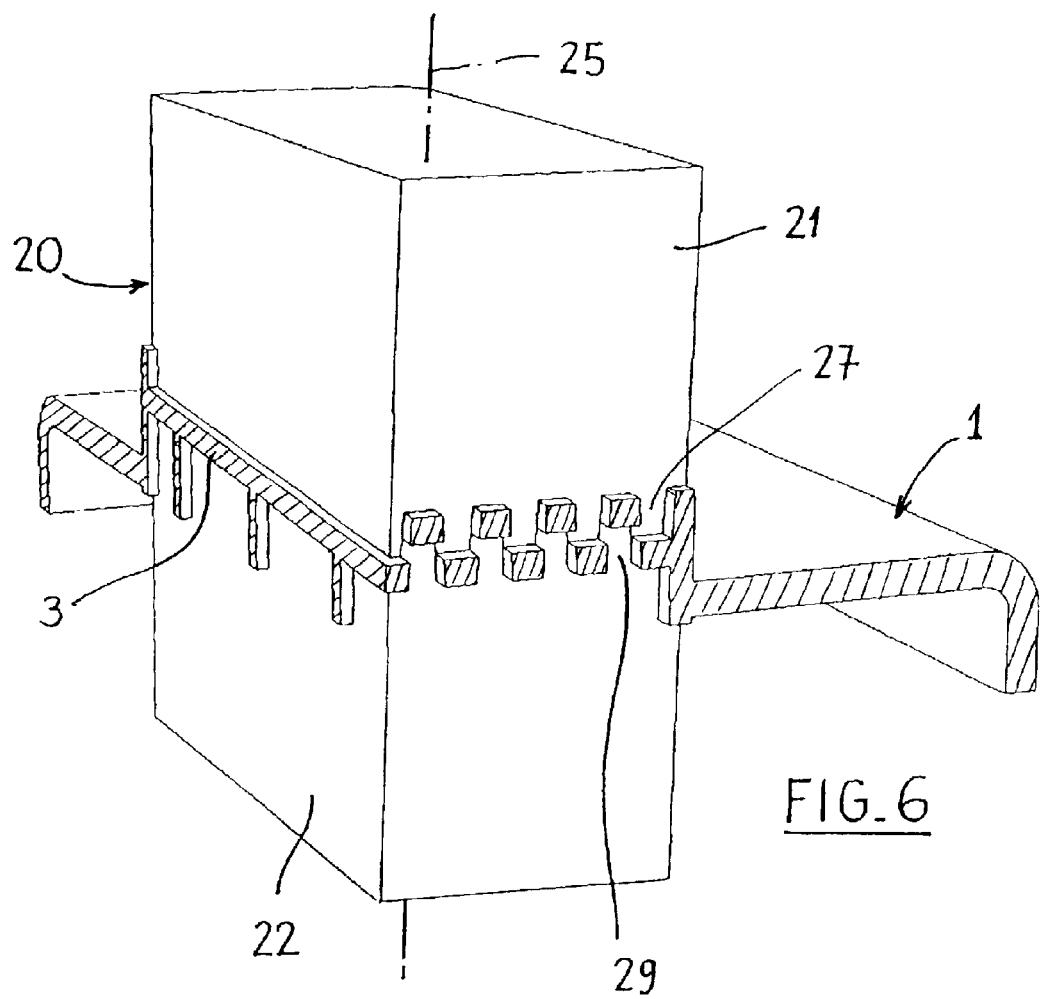
FIG_6
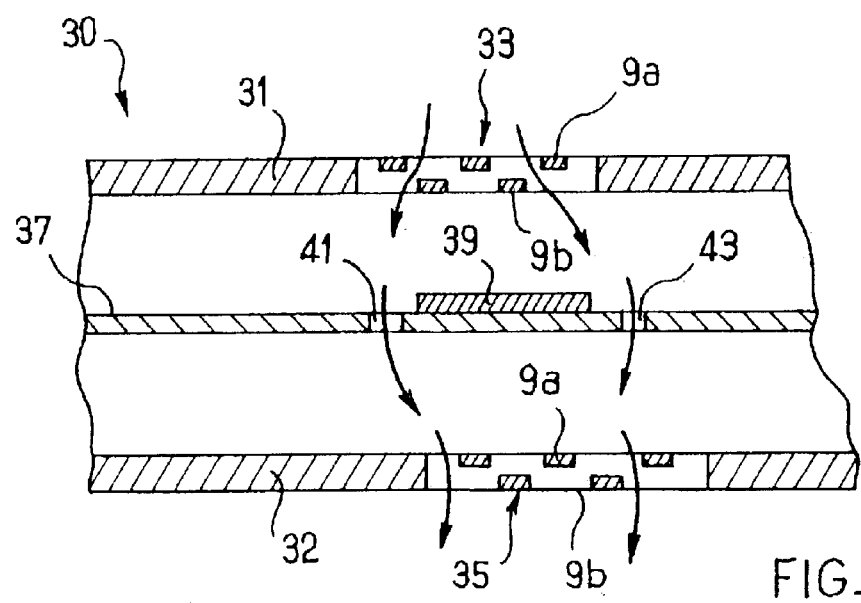
FIG_7

HOUSING VENTILATION SYSTEM, HOUSING AND HOUSING PORTION, USE OF SAID SYSTEM, AND MOLD FOR MANUFACTURING

BACKGROUND OF THE INVENTION

The invention relates to the ventilation of a housing, in particular a housing that may contain electronic components, in a land vehicle such as a car, under the engine hood (bonnet).

DESCRIPTION OF THE RELATED ART

Ventilation systems formed on a housing or a housing portion that has to house a contents, and has ventilation grids for said contents that are formed from segments of material leaving a gap between them, are already known.

However, it transpires that, in particular when the housing has to contain members that heat up (such as the aforementioned electronic components) or more generally when it is desired to obtain a flow of air (gaseous fluid) in accordance with the expected ventilation of the contents of the housing (for example 0.2 m/s, without recourse to forced air), a conventional ventilation grid proved to be inappropriate.

SUMMARY OF THE INVENTION

In addition, to improve the conditions of entry of the gaseous fluid into the housing, but not to the detriment of other possible requirements (see below), according to an important feature of the invention it is recommended that the aforementioned ventilation system be such that said segments of material are arranged at at least two levels offset depthwise in the general direction of entry of the gaseous fluid into the housing or the housing portion through the grid in question, in order to constitute, by grid, a multiple-grid system, the grids being offset depthwise with respect to one another.

Two additional requirements may furthermore be satisfied:
  firstly that of providing, at the location of a ventilation grid, an anti-intrusion effect, preventing the intrusion of a solid (such as a thin straight rod) of a set diameter (IP4X standard at the date of filing of the present application);
  to provide less expensive molding manufacturing conditions comparable with the requirements of the marketplace.

In this case, according to an additional feature of the invention it is recommended that the ventilation system be such that, between the levels, the segments of material are transversely offset depthwise so that they do not overlap between two adjacent levels.

A complementary (or alternative) way of satisfying the same requirements consists in ensuring that, at two adjacent levels, the segments of material are arranged approximately in a staggered configuration.

Again, to satisfy simple and inexpensive manufacturing conditions, while ensuring that the ventilation system has dimensions suitable for its application, with in addition a favorable effect as regards the amount of air that can be taken into the housing, according to another feature of the invention it is recommended that the segments of material forming the multiple-grid system consist of bars approximately parallel to one another.

In certain cases, the abovementioned ventilation grids may be in contact with small amounts of water (slight local trickling, condensation, etc.).

In this case, in relation to an embodiment of the segments of material in the form of bars, according to another feature of the invention it is recommended that the ventilation system be formed as a projection on the outer face (the opposite face to that directed toward the content of the housing) of the wall (or of at least one of the walls) of the housing that carries the system, and in addition has a slope in one direction.

Thus, the encroachment on the internal space of the housing is avoided and it will be possible to encourage the flow of liquid droplets, along the slope.

Again, to favor the molding manufacturing conditions, while at the same time increasing the strength of the grid system, according to another feature of the invention it is recommended that the system comprise ribbing extending transversely beneath the last level with respect to the direction of flow of the ventilating fluid entering the housing.

As will have already been understood, the ventilation system of the invention is intended to be formed on (and preferably integral with) a housing or a housing portion.

To achieve the aforementioned "mechanical anti-intrusion" effect, the system for ventilating this housing, or this housing portion, will preferably be such that the distance between two adjacent segments of material is less than about 1 millimeter (or even 0.8 millimeters).

For the purpose of further improving the flow of air inside the housing, provision is also made according to another feature of the invention for at least two grids, each consisting of one of the multiple-grid systems, to be at least partly located face to face on two opposed walls of the housing, or in a relative situation in the immediate vicinity of such a face-to-face arrangement.

Advantageously, the housing will comprise at least two housing portions cooperating with each other to form a closed complete housing, thus favoring compliance with the aforementioned standard, and making it easier to mount the contents in the housing, or even to replace them in the event of failure.

Again to favor the flow of air (or more generally of the gaseous fluid) for cooling the contents of the housing (most particularly when these are electronic components), according to another feature of the invention it is recommended that the housing be such that:
  it comprises first and second offset multiple-grid systems formed in two opposed walls of this housing;
  the contents of the housing comprises electronic components based on at least one board installed in the housing, approximately parallel to the levels of the grid systems;
  the board(s) fitted with electronic components is(are) drilled with holes for air to flow from one side of the board to the other; and
  at least one of these holes and at least one portion of the first and second multiple-grid systems are approximately aligned for an approximately rectilinear flow of air inside the housing, between the first and second grid systems.

As indicated above, if the improved housing of the invention contains electronic components, it is particularly intended to be placed under an engine hood, in a confined space.

One aspect of the invention therefore relates to the use of one or more of the abovementioned ventilation systems on such a housing or housing portion for electronic components, with as feature the fact that unforced air, at atmospheric pressure, is then made to pass through said multiple-grid system(s).

Thus, despite the absence of blown air (or of extracted air), effective cooling of the electronic components will be obtained.

As already indicated, certain features of the ventilation system of the invention are conducive to an inexpensive and effective method of manufacture by molding.

Thus, one of the additional aspects of the invention, allowing a system of offset grids to be manufactured with segments of material not overlapping one another between two adjacent levels, consists of a mold comprising first and second blocks placed approximately face to face and each having a molding face for defining at least one molding cavity for molding said housing portion, the molding face of each block having a crenelation formed from alternating projections and recesses offset from one face to the other so that the projections on one face penetrate the recesses in the other face, in the molding position of the two blocks of the mold.

BRIEF DESCRIPTION OF THE DRAWINGS

Another more detailed description of the invention will now be provided in conjunction with the appended drawings in which:

FIGS. 1 to 3 show schematically, on different scales, the improved ventilation system of the invention on a housing wall;

FIG. 4 shows schematically two vertically offset segments of material;

FIGS. 5 and 6 show two steps in the manufacture of an improved ventilation system according to the invention, on a housing wall; and FIG. 7 shows schematically, in cross section, a local view inside a housing containing a board for electronic components, with "substantially linear" flow of air favoring a "chimney" effect.

DESCRIPTION OF THE PREFERRED EMBODIMENT

FIG. 1 shows a wall 1 of a plastic housing comprising a ventilation system 3 according to the invention.

The wall 1 may consist of a wall part of one-piece housing or of a portion of a housing consisting of several portions that can be joined together to form a closed, complete housing.

In the present case, the ventilation system 3 is integral with the wall 1. It was manufactured by molding, at the same time as this wall. The material of which it is made is a rigid plastic.

The ventilation system 3 is in the form of a grid consisting of segments of material, such as 5a, 5b, 5c (see also FIGS. 2 and 3), leaving a gap between them so that a flow of gaseous fluid can enter or leave through the ventilation system (gaps marked 7).

As will be more clearly seen in FIGS. 2 and 3, the segments of material such as 5a, 5b, 5c are placed at several levels, in this case two levels 9a, 9b (see FIGS. 2 and 3), offset depthwise along the general direction of entry (exit) of the gaseous fluid through said grid, as shown schematically by the axis 11 in FIG. 2.

If the depth is considered as corresponding to the vertical (see FIG. 2), the segments of material between the levels such as 9a, 9b will advantageously be transversely offset depthwise (that is to say then in a horizontal plane) so as not to be directly superposed by groups of two in this case. In particular, to favor the manufacture of the part by molding, it would be advantageous to avoid the segments of material overlapping between the levels, thus allowing molding in a "north-south" mold, without lateral sliders.

As may be clearly seen in the FIGS. 2 and 3, the segments of material such as 5a, 5b, 5c are, at the two adjacent levels shown, arranged approximately in a staggered configuration.

For quality of the ventilation (if this is natural, unforced, ventilation) and again in order to obtain relatively simple and inexpensive molding manufacturing conditions, the segments of material forming the multiple-grid system illustrated have been made in the form of bars approximately parallel to one another (especially bars 5a, 5b, 5c) at the various levels or stages of the systems illustrated.

To ensure favorable filling of the molding cavity and to increase the mechanical stability of the grid system, FIGS. 2 and 3 show, on the same side as the inner face 1a of the wall 1 (the face directed toward the internal contents of the housing, and therefore on the opposite side from the face 1b directed toward the outside), transverse ribs 13 extend below the innermost level 9b of the grid system illustrated.

The ribs 13 extend here perpendicular to the general direction 15 of extension of the bars, such as 5a, 5b and 5c, of the grid.

The ribs 13 furthermore have indentations 17 extending, at the location of the gaps 7, between two adjacent bars of the level 9b, to join the intermediate bars of the other level so that all the bars can be consolidated by these transverse ribs.

In particular, FIGS. 1 and 2 show that the ventilation system 3 is formed as a projection on the outer face 1b of the wall 1.

It may furthermore be seen that the bars of the grid illustrated have a slope. In this case, the slope lies along the length direction (the longitudinal direction 15 of extension of the bars).

By keeping a suitable distance between two adjacent bars, such a slope could allow liquid droplets to flow off more easily.

It is currently a requirement, especially if the housing in question has to contain electronic components, for the openings formed in this housing to comply with an "anti-intrusion" standard (IP4X standard) that defines a sealing of a product with respect to a solid (in particular a straight rigid metal rod) having a minimum diameter of 0.8 mm.

To meet this requirement, the geometry of the grid of the invention is then chosen so that the distance between two adjacent segments of material is less than about 1 mm (or even 0.8 mm) at the various levels (9a, 9b), including under the hypothesis of insertion not in the direction 11, but at an inclined, oblique direction.

To do this, it is preferred to adopt the following dimensions:

thickness e of the bars: about 1.2 millimeters;
common length L of these bars: about 1.6 millimeters; and
depthwise offset between two levels (such as 9a, 9b): e'=about 1.08 millimeters.

It should also be noted, as may be seen in FIG. 4, that there will preferably be a distance L between two walls alongside two adjacent segments of material at two different levels (such as 5b and 5c in FIG. 4), this being perpendicular to the general direction 11 along which the levels of the ventilation system are staged.

Thus, looking along the direction 11, as in FIG. 4, there will preferably be gaps between all the bars although there are differences in levels.

It should be pointed out that the cross section of the bars—truncated pyramid with a rectangular base—is favorable to demolding (taper angle).

FIG. 5 therefore shows a mold for manufacturing a piece, such as the piece 1 in FIG. 1, in plastic.

This mold, labeled 20, comprises two blocks 21, 22 (die/punch) placed approximately face to face and each having a molding face, 21a, 22a respectively, so as to define, between these faces, at least one molding cavity 23.

The two blocks 21, 22 are designed and controlled so as to move away from or toward each other along the general direction 25.

The molding face of each block has a crenelation 27, 29 formed from projections and recesses, alternating in an offset manner from one face to the other, so that the projections from one face penetrate the recesses in the other face, in the molding position of the two blocks of the mold, as illustrated in FIG. 6.

Of course, the heights (in the direction 25) of the projections and recesses will have been adjusted so that the various molding "subcavities" provide the two levels of segments of material illustrated, for example, in FIG. 4 within the molding cavity 23.

In FIG. 6, it may be imagined that, with the mold 20 being closed (blocks 21, 22 brought together to their maximum in the direction 25), a quantity of fluid plastic under a suitable pressure is injected in order to obtain, in the molding cavity 23, the system of offset grids of the invention, while in FIG. 5 the mold is open allowing the part 1 to be seen with its grid system 3.

The taper angles of the crenelations 27, 29 of the two mold blocks will preferably be adapted, in relation to the axial closing/opening direction 25 of the mold, for avoiding having to use a mold with slides requiring ancillary parts that can move in at least one direction transverse with respect to the direction 25, or other complications.

FIG. 7 shows a plastic housing 30. This may be a housing made of two portions 31, 32 each manufactured with the mold 20.

The two portions 31, 32 have been designed to cooperate so that when they are joined together a closed complete housing 30 can be obtained.

Each portion 30, 31 incorporates a ventilation system (respectively 33 and 35) according to the invention.

Extending inside the volume of the housing, between the two walls 31, 32, there is a board 37 (a printed circuit) that supports an electronic component 39.

The two grid systems 33, 35 are placed in an immediately close relative situation of a face-to-face arrangement (very slight lateral offset in the figure).

The plate 37 extends approximately parallel to the levels 9a, 9b of the grids 33, 35 and the board is drilled with holes 41, 43 for the gaseous fluid in question to flow from one side of the board to the other.

To obtain a "chimney effect" (that is to say to obtain an approximately linear flow of air inside the housing between the grids 33 and 35, as illustrated by the arrows in FIG. 7), the two grid systems and the holes 41 and 43 are substantially in alignment.

In the preferred example illustrated, a gaseous ventilation fluid that enters the inside of the housing 30 (and emerges therefrom on the opposite wall), after having cooled the electronic component 39, consists of unforced air at atmospheric pressure.

| List of reference symbols | |
|---|---|
| 1 | Wall |
| 1a | Inner face |
| 1b | Outer face |
| 3 | Ventilation system |
| 5a, 5b, 5c | Segments of material |
| 7 | Gap |
| 9a, 9b | Grid levels |
| 11 | General direction of air entry/exit |
| 13 | Transverse ribs |
| 15 | General direction of extension of the bars |
| 17 | Indentations |
| 20 | Mold |
| 21 | Mold block (die) |
| 21a, 22a | Molding face of the mold |
| 22 | Mold block (punch) |
| 23 | Molding cavity |
| 25 | Direction of movement of the mold portions |
| 27, 29 | Crenelation |
| 30 | Plastic housing |
| 31, 32 | Two housing portions |
| 33, 35 | Ventilation system according to the invention |
| 37 | Board |
| 39 | Electronic component |
| 41, 43 | Holes in the IC board |
| e | Thickness of the bars |
| L | Common length |
| e' | Depthwise offset |
| l | Distance |

What is claimed is:

1. A ventilation system on a housing or a housing portion that houses a contents (39) and has ventilation grids (3; 33, 35) for said contents, said grids being formed from segments of material leaving a gap (7) between them, characterized in that these segments of material (5a, 5b, 5c) are arranged at at least two levels (9a, 9b) offset depthwise in the general direction (11) of entry of a gaseous fluid into the housing or the housing portion through the grid in question, in order to constitute, by grid, a multiple-grid system, the grids being offset depthwise with respect to one another, between the levels (9a, 9b), the segments of material are offset transversely to the depth so that they do not overlap between two adjacent levels, at the various levels, the segments of material (5a, 5b, 5c) forming the multiple-grid system comprise bars approximately parallel to one another, and all the segments are part of a projection from an outer face (1b) of an exterior surface of the housing, the projection having a slope in one direction with respect to the exterior surface.

2. The system as claimed in claim 1, characterized in that, at two adjacent levels, the segments of material (5a, 5b, 5c) are placed substantially in a staggered configuration.

3. The system as claimed in claim 1, characterized in that it includes ribbing (13) extending transversely beneath the last level (9b) with respect to the direction of flow (11) of the ventilating fluid entering the housing.

4. A portion of a housing comprising a ventilation system as claimed in claim 1, preferably with a distance between two adjacent segments of material (5a, 5b) of less than about 1 mm, for an anti-intrusion effect.

5. A ventilation system on a housing or a housing portion that houses a contents (39) and has ventilation grids (3; 33, 35) for said contents, said grids being formed from segments of material leaving a gap (7) between them, characterized in that these segments of material (5a, 5b, 5c) are arranged at at least two levels (9a, 9b) offset depthwise in the general direction (11) of entry of a gaseous fluid into the housing or the housing portion through the grid in question, in order to constitute, by grid, a multiple-grid system, the grids being offset depthwise with respect to one another, with a distance between two adjacent segments of material (5a, 5b) of less than about 1 mm, for an anti-intrusion effect, and further comprising at least two housing portions (31, 32) cooperating with one another to form a closed complete housing, at least two grids (33, 35), each consisting of a said multiple-grid system and belonging to the two housing portions, being arranged at least partly approximately face to face, or in a relative situation in the immediate vicinity of such a face-to-face arrangement.

6. A ventilation system on a housing or a housing portion that houses a contents (39) and has ventilation grids (3; 33, 35) for said contents, said grids being formed from segments of material leaving a gap (7) between them, characterized in that these segments of material (5a, 5b, 5c) are arranged at at least two levels (9a, 9b) offset depthwise in the general direction (11) of entry of a gaseous fluid into the housing or the housing portion through the grid in question, in order to constitute, by grid, a multiple-grid system, the grids being offset depthwise with respect to one another, with a distance between two adjacent segments of material (5a, 5b) of less than about 1 mm, for an anti-intrusion effect, characterized in that:

it comprises first and second offset multiple-grid systems (33, 35) formed in two opposed walls of this housing;

the contents of the housing comprises electronic components (39) placed on at least one board (37) installed in the housing, approximately parallel to the levels of the grid systems;

the board(s) fitted with electronic components is(are) drilled with holes (41, 43) for air to flow from one side of the board to the other; and at least one of these holes and at least one portion of the first and second multiple-grid systems are approximately aligned for an approximately rectilinear flow of air inside the housing, between the first and second grid systems (33, 35).

7. The use of one or more ventilation systems as claimed in claim 1 on a housing or a housing portion for electronic components, characterized in that unforced air at atmospheric pressure is made to pass through said multiple-grid system(s) (3; 33, 35).

8. A mold for manufacturing at least one housing portion to house a contents (39) and having ventilation grids (3; 33, 35) for said contents, said grids being formed from segments of material leaving a gap (7) between them, characterized in that these segments of material (5a, 5b, 5c) are arranged at at least two levels (9a, 9b) offset depthwise in the general direction (11) of entry of a gaseous fluid into the housing or the housing portion through the grid in question, in order to constitute, by grid, a multiple-grid system, the grids being offset depthwise with respect to one another, between the levels (9a, 9b), the segments of material are offset transversely to the depth so that they do not overlap between two adjacent levels, at the various levels, the segments of material (5a, 5b, 5c) forming the multiple-grid system comprise bars approximately parallel to one another, the mold comprising:

first and second blocks (21, 22) placed approximately face to face and each having a molding face for defining at least one molding cavity (23) for molding said housing portion, the molding face of each block having a crenelation formed from alternating projections and recesses (27, 29) offset from one face to the other so that the projections on one face penetrate the recesses in the other face, in the molding position of the two blocks of the mold.

9. The system as claimed in claim 1, characterized in that, at the various levels, the segments of material (5a, 5b, 5c) forming the multiple-grid system consist of bars approximately parallel to one another.

10. A ventilation system, comprising:

a ventilation housing having an upper exterior surface; and ventilation grids located on the upper exterior surface, the grids being comprised of plural longitudinal segments spaced apart by a gap between adjacent segments, the segments arranged in at least two levels offset depthwise in a general direction orthogonal to the upper exterior surface and constituting at least a first grid layer offset depthwise with respect to a second grid layer.

11. The system of claim 10, further comprising:

a lower exterior surface of the ventilation housing; and further ventilation grids located on the lower exterior surface, the further grids being comprised of plural parallel longitudinal segments spaced apart by a gap between adjacent segments, the segments of the further grids arranged in at least two levels offset depthwise in a general direction orthogonal to the lower exterior surface and constituting at least a third grid layer offset depthwise with respect to a fourth grid layer.

12. The system of claim 10, wherein between the first and second grid layers, the segments are offset transversely to the depth so that a lower surface of the first grid layer is depthwise spaced apart from an upper surface of the second grid layer.

13. The system of claim 10, wherein, a single segment of the second grid layer is located between two adjacent segments of the first layer, the single segment offset depthwise from the two adjacent segments.

14. The system of claim 10, wherein the segments are approximately parallel to adjacent segments.

15. The system of claim 14, wherein, the ventilation grids, located on the upper exterior surface, have an upper surface that extends above the upper exterior surface and slopes with respect to the upper exterior surface.

16. The system of claim 10, further comprising:

plural ribs extending transversely beneath and contacting the first and second grid layers.

* * * * *